United States Patent [19]
Douglas

[11] Patent Number: 5,418,114
[45] Date of Patent: May 23, 1995

[54] ANISOTROPIC LIQUID PHASE PHOTOCHEMICAL MERCURY CADMIUM TELLURIDE ETCH

[75] Inventor: Monte A. Douglas, Coppell, Tex.

[73] Assignee: Texas Instruments Incorporated, Dallas, Tex.

[21] Appl. No.: 141,354

[22] Filed: Oct. 22, 1993

Related U.S. Application Data

[63] Continuation of Ser. No. 954,130, Sep. 30, 1992, abandoned.

[51] Int. Cl.⁶ .................... G03F 7/00; C25F 3/12; C25F 3/14
[52] U.S. Cl. .................... 430/320; 430/328; 204/129.3; 204/129.65; 204/129.75; 216/46; 216/87
[58] Field of Search .............. 430/322, 323, 328, 329, 430/396, 320; 156/643, 644, 659.1; 204/129.3, 129.65, 129.75

[56] References Cited

U.S. PATENT DOCUMENTS

| | | | |
|---|---|---|---|
| 4,391,683 | 7/1983 | Buckley | 204/129.3 |
| 4,414,066 | 11/1983 | Forrest | 204/129.3 |
| 4,415,414 | 11/1983 | Burton | 204/129.3 |
| 5,157,000 | 10/1992 | Elkind | 156/646 |
| 5,165,283 | 11/1992 | Kurtz | 73/727 |

Primary Examiner—Kathleen Duda
Attorney, Agent, or Firm—Chris D. Pylant; Richard A. Stoltz; James C. Kestersom

[57] ABSTRACT

A mercury cadmium telluride (MCT) substrate 30 is immersed in a liquid 34 (e.g. 0.1 molar concentration hydrochloric acid) and illuminated with collimated radiation 24 (e.g. collimated visible/ultraviolet radiation) produced by a radiation source 20 (e.g. a 150 Watt mercury xenon arc lamp). A window 26 which is substantially transparent to the collimated radiation 24 allows the radiated energy to reach the MCT substrate 30. An etch mask 32 may be positioned between the radiation source 20 and the substrate 30. The MCT substrate 30 and liquid 34 may be maintained at a nominal temperature (e.g. 25° C.). Without illumination, the MCT is not appreciably etched by the liquid. Upon illumination the etch rate is substantially increased. A further aspect is the addition of a passivant (e.g. iodine) to the liquid which forms a substantially insoluble passivation layer 36 on the substrate which is removed or partially removed by the radiation 24. Sidewalls 40 are protected from the etchant by vertical passivation layers 42, further increasing the difference between the illuminated and uniiluminated etch rates.

27 Claims, 2 Drawing Sheets

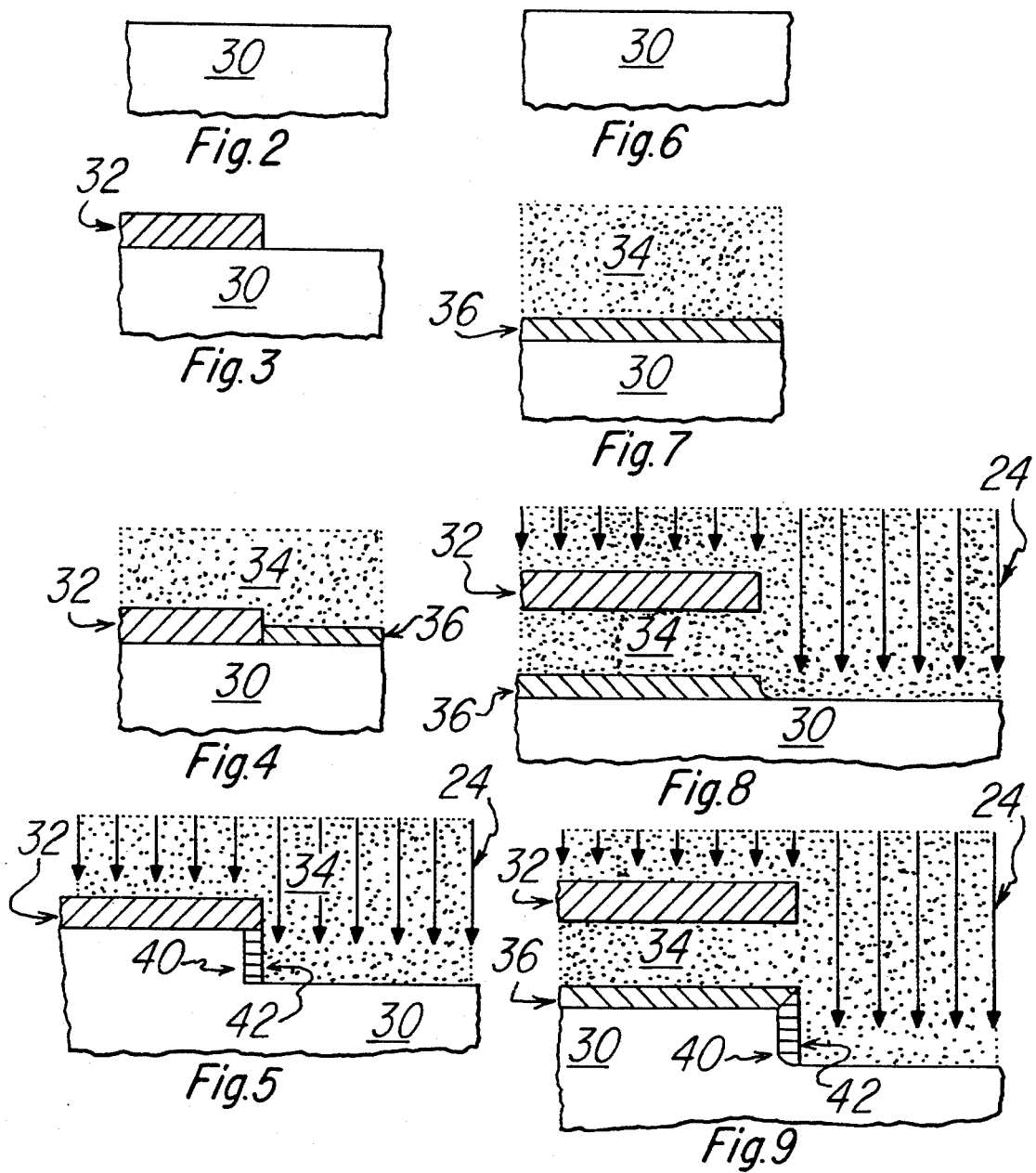

ANISOTROPIC LIQUID PHASE PHOTOCHEMICAL MERCURY CADMIUM TELLURIDE ETCH

This application is a Continuation of application Ser. No. 07/954,130, filed Sep. 30, 1992, now abandoned.

CROSS-REFERENCE TO RELATED APPLICATIONS

The following related applications were filed concurrently with the instant application:

| Title | Inventor | Ser. No. |
| --- | --- | --- |
| Anisotropic Liquid Phase Photochemical Copper Etch | Douglas | 07/954,087, now abandoned. |
| Anisotropic Liquid Phase Photochemical Etch Method | Douglas | 07/954,131 |

FIELD OF THE INVENTION

This invention generally relates to the etching of mercury cadmium telluride.

BACKGROUND OF THE INVENTION

Without limiting the scope of the invention, its background is described in connection with current methods of etching mercury cadmium telluride.

Mercury cadmium telluride, hereafter referred to as MCT, has been widely used to detect infrared radiation. FLIR (forward looking infrared) systems produce a visible image of an infrared scene, providing the ability to see variations in temperature in the absence of visible illumination. Such systems have been used for 'night vision' by the military for many years, and many FLIR systems use MCT as the detector material. MCT has an electronic bandgap which is well suited to the detection of infrared photons. The bandgap may be adjusted by varying the ratio of mercury to cadmium, giving a range of wavelength sensitivity from less than 3 microns to more than 14 microns. MCT is frequently fabricated into linear arrays which are scanned in the focal plane of an imaging optical system in order to sense the two-dimensional infrared scene, or two-dimensional 'starring' focal plane arrays of MCT detectors may be fabricated to sense the scene without mechanical scanning. Such arrays may be fabricated on a semiconductor substrate which may provide, for example, electrical connections and/or signal conditioning functions. Signals from the detectors are then typically represented on a display as a grey-scale image, each pixel of which represents the infrared intensity at the corresponding location in the scene.

MCT generally must be patterned during the fabrication of both discrete detector devices and linear and two-dimensional arrays of detectors. Patterning of the MCT material is a critical step in the manufacture of these devices and systems. Heretofore, in this field, MCT has been patterned in a variety of ways. MCT may be etched in bromine, typically 1 to 5 percent $Br_2$ in a methanol solution. Plasma etching and ion milling of MCT with hydrocarbon or halogen reagents are also known.

SUMMARY OF THE INVENTION

It has been discovered that current methods of patterning MCT are not ideal. Wet etching with bromine, while causing little or no damage to the material, is isotropic and not useful for patterning advanced geometries required by competitive advanced detector designs, such as dense focal plane arrays which provide high resolution. Plasma etching and/or ion milling with hydrocarbon or halogen reagents provides directionality, but the associated plasmas may induce an unacceptable degree of damage into the material causing degraded device performance, yield and reliability. Prior techniques for patterning MCT therefore represent a tradeoff between fine feature size (given by directional etches) and device performance (generally preserved by wet etches).

Tradeoffs in the prior art are overcome by the invention presented. Generally, and in one form of the invention, patterning of MCT is accomplished by immersing it in a liquid and then exposing it to electromagnetic radiation, causing illuminated portions of the MCT to be etched and unilluminated portions to remain substantially unetched. The process presented is therefore an anisotropic liquid phase photochemical MCT etch. Preferably, MCT is etched by immersing it in hydrochloric acid and illuminating it with visible and ultraviolet radiation provided by a mercury/xenon arc lamp. Preferably, an etch mask is used to define the pattern of illumination at the surface and thereby define the etch pattern. The highly directional nature of light makes this an anisotropic etch method. A further aspect of this invention is the addition of a chemical passivant such as iodic acid ($HIO_3$) to the liquid which protects sidewalls from the etchant, further increasing the difference between the illuminated and unilluminated etch rates.

This is apparently the first MCT etch method to make use of electronic excitation caused by photo-irradiation in a reaction between MCT and a liquid (e.g. hydrochloric acid). The invention gives many advantages. A major advantage of the invention is that it anisotropic (i.e does not cause substantial undercut). Those regions under the mask remain in shadow and are not appreciably etched. In addition, it has been found that this method does not cause unacceptable defects in the MCT material. Contamination from plasma species is prevented. Generally, no high temperature anneal is required.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings:

FIGS. 2–5 are microscopic cross sections of a MCT substrate undergoing liquid phase photochemical etching which depict the function of etch passivation when the etch mask is in contact with the substrate.

FIGS. 6–9 are microscopic cross sections of a MCT substrate undergoing liquid phase photochemical etching which depict the function of etch passivation when the etch mask is displaced from the substrate.

DETAILED DESCRIPTION OF THE PREFERRED EMBODIMENTS

Figure 1:
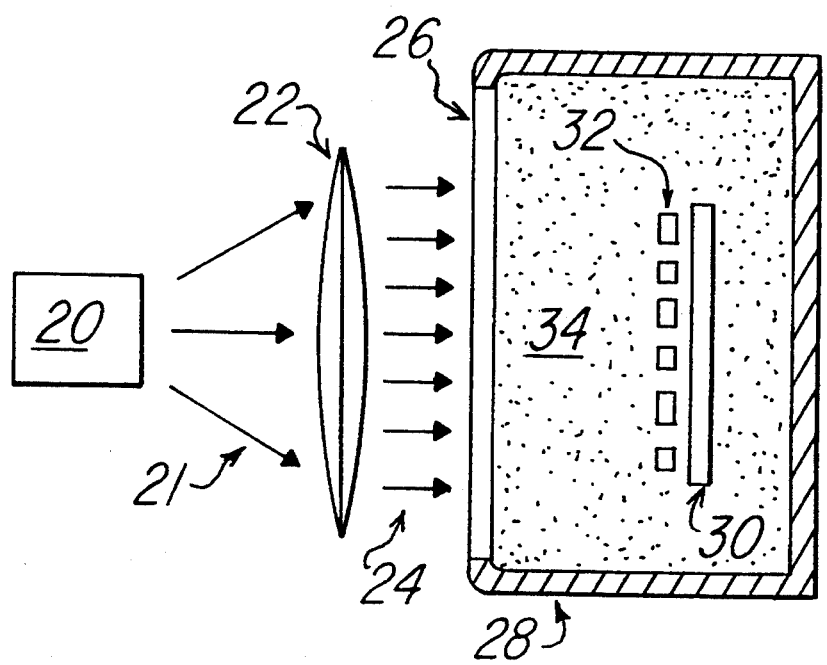
FIG. 1 is a representation of the apparatus and materials used to anisotropically etch MCT.

In a first preferred embodiment of this invention and with reference to FIG. 1, a pattern is etched into a MCT substrate 30 which is immersed in liquid 34 and illuminated with substantially collimated radiation 24 propagating substantially orthogonal to the MCT substrate 30 produced by a radiation source 20. Radiation 21 from the radiation source 20 is collimated by collimating optics 22 and the resulting collimated radiation 24 is directed at the MCT substrate 30. A window 26 which is a portion of the reaction vessel 28 and which is substantially transparent to the collimated radiation 24 allows the radiated energy to reach the MCT substrate 30. An etch mask 32 defines the etched pattern by blocking the radiation at portions of the substrate. The MCT substrate 30 and liquid 34 are nominally at a temperature of 25° C. Preferably, the liquid is 0.1% molar concentration hydrochloric acid and the radiation source is a 150 Watt mercury/xenon lamp. At such a temperature and acid concentration and without illumination, MCT is not appreciably etched by HCl. Upon illumination by visible/ultraviolet radiation produced by the lamp, however, the etch rate increases substantially.

The etch mask 32 between the radiation source 20 and the MCT substrate 30 is preferably located close to or in contact with the surface to be etched. The etch mask 32 may be deposited onto the substrate surface, which may be referred to as a surface etch mask. A mask deposited on the surface need not be opaque. The etch mask 32 is preferably made of patterned chromium or silicon dioxide. In general, any substance may be used which is sufficiently opaque to visible and ultraviolet light such as that produced by the mercury/xenon lamp (e.g. photoresist or chromium) and/or which is not substantially penetrated or etched by the liquid (e.g. silicon nitride). Those areas of the substrate which are both in contact with the solution and illuminated will be subject to etching by the acid solution.

It is believed, in part because of the relatively low power of the light source, that the etching reaction is accelerated in the illuminated areas because of electronic excitation due to photo-irradiation rather than from thermal effects (i.e., the etched and unetched areas of the surface are at substantially the same temperature). As used herein, the term "radiation" means radiation at levels above background and this means, for example, illumination at levels substantially greater than room lighting.

A second preferred embodiment of this invention is described with reference to FIGS. 2, 3, 4 and 5, which illustrate anisotropic liquid phase etching of MCT with passivation where the etch mask is in contact with the MCT substrate. FIG. 2 shows a greatly magnified cross section of a MCT substrate 30. FIG. 3 shows the surface of the MCT substrate partially covered with an etch mask 32. This etch mask may be formed of photoresist by standard photolithographic techniques, or may be any material which is etch resistant (and preferably opaque to the illuminating radiation) and which adheres to the surface. FIG. 4 depicts the substrate and etch mask immersed in a liquid 34. The liquid contains one or more etchants and one or more passivants. A passivant is chosen such that it causes the formation of a thin insoluble passivation layer 36 to form on the exposed surface of the substrate. This layer is typically extremely thin (possibly a monolayer); its thickness is greatly exaggerated in the figures for clarity. This insoluble layer prevents the etchant from etching the substrate. Upon illumination with radiation 24, as depicted in FIG. 5, the passivation layer 36 is removed from the substrate 30 and etching proceeds in areas which are illuminated. A substantially vertical sidewall 40 forms, which is protected from etching by the vertical passivation layer 42. This vertical passivation layer 42 is not removed from the sidewall 40 because it is in the shadow of the etch mask 32.

In the second preferred embodiment, an etchant is chosen which will etch the substrate (in the absence of a passivation layer) with or without the presence of the illuminating radiation. The passivant is chosen to form a layer on the substrate surface which is removed or partially removed by radiation. Although the mechanism or explanation for this removal is uncertain, it is thought that the passivant bonds to the surface under no illumination, but is detached from the surface and re-enters solution when illuminated.

A third preferred embodiment of this invention is described with reference to FIGS. 6, 7, 8 and 9 which illustrate anisotropic liquid phase etching of MCT where the etch mask is displaced from the substrate to be etched. FIG. 6 shows a greatly magnified cross section of an MCT substrate 30. FIG. 7 shows the surface of the substrate immersed in a liquid 34. Again, the liquid contains one or more etchants and one or more passivants. A passivant is chosen so that it causes the formation of a thin insoluble passivation layer 36. This layer is again typically extremely thin (possibly a monolayer) with its thickness greatly exaggerated in the figures for clarity. This insoluble layer substantially prevents the etchant(s) from etching the substrate. As shown in FIG. 8, an etch mask 32 is positioned above the substrate 30 so that it blocks the collimated radiation 24 at selected portions of the substrate. This etch mask may be any material which is sufficiently opaque to the illuminating radiation, and is not necessarily positioned within the liquid. Upon illumination with radiation, as depicted in FIG. 9, the insoluble passivation layer 36 is removed from the substrate 30 in those areas where the radiation is not blocked by the etch mask 32. With the passivation layer removed, etching of the substrate proceeds in those illuminated areas. Again, a substantially vertical sidewall 40 forms, which is protected from etching by the vertical passivation layer 42. This vertical passivation layer 42 is not removed from the sidewall 40 because it is in the shadow of the etch mask 32.

An important aspect of the second and third preferred embodiments is the automatic passivation of sidewalls as they are formed. As depicted in the figures, sidewalls are created when illuminated areas are removed by etching. The sidewalls are etched only to the point where they are under shadow of the etch mask. The passivation layer then remains on the vertical surface and the sidewall is protected from further etching. Very high etch anisotropy is achieved.

It should be noted that the etch rate of some liquid etches, such as that described in the first preferred embodiment, may be accelerated by illuminating radiation, thereby exhibiting some anisotropy without passivation. The technique set forth in the second and third preferred embodiments (those including passivation) may be used with these photochemical wet etches to further enhance their anisotropy (i.e. increase the ratio of illuminated etch rate to unilluminated etch rate).

In another embodiment of this invention, the material etched a material similar to MCT, such as cadmium telluride.

In yet other embodiments, the liquid may be from the class of solutions that etch the material without light irradiation. In this case, the radiation accelerates the etch rate on illuminated portions of the substrate, resulting in a less isotropic etch. Still other alternate embodiments include liquids containing salts and liquids with pH values less than or equal to seven (i.e. acids and neutral solutions).

In yet another embodiment of this invention, MCT may be patterned by projecting a light of spatially non-uniform intensity onto the submersed MCT surface (similar to the projection techniques common in photolithography).

In still other embodiments of this invention, the liquid may be made to flow with respect to the substrate. The flow rate of the liquid may be varied. The solution temperature can be varied to achieve different etch rates and etch anisotropy. The photon flux (i.e. illumination intensity) may be varied (spatially and/or temporally) to impact etch directionality and etch rates. The radiation wavelength can be adjusted to achieve different etch directionality and etch rates. The radiation may be monochromatic. The direction of propagation of the radiation need not be normal to the surface. The etch solution may be a mixture of solutions (e.g. one or more passivating agents to enhance anisotropy and one or more reagents to photochemically etch the material).

The sole Table, below, provides an overview of some embodiments and the drawing.

Experimental results indicate an illuminated to unilluminated etch rate ratio of over twelve to one can be achieved at an etch rate of over 2000 Å per minute with (a) 0.1% molar $HIO_3$ or (b) 0.1% molar $HIO_3$ and 0.1% molar HCl solutions. From these results, it is clear that water can act as an etchant for MCT.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the liquid may be acidic, neutral or basic. Salt solutions are contemplated, as well as solutions containing organic solvents. Pure water may be used as an etchant. It is therefore intended that the appended claims encompass any such modifications or embodiments.

What is claimed is:

1. A method to anisotropically etch mercury cadmium telluride, said method comprising:
   forming an etch mask on a surface of said mercury cadmium telluride to produce a masked surface;
   immersing said masked surface in a liquid; and
   illuminating said masked surface with radiation,
wherein illuminated areas and substantially unilluminated areas of said surface are produced and said illuminated areas are etched at a substantially greater rate than said unilluminated areas.

TABLE

| Figure Element | Generic Term | Preferred or Specific Term | Function/Alternate Terms |
| --- | --- | --- | --- |
| 20 | Radiation Source | 150 Watt mercury/xenon arc lamp | Metal-Halide lamp<br>Microwave lamp<br>Black light florescent lamp |
| 21 | Radiation | Visible/UV light | Radiation which will penetrate the liquid; accelerates the etch and/or removes or partially removes passivation layer if present |
| 22 | Collimating Optics |  | Collimates radiation from radiation source |
| 24 | Collimated Radiation | Collimated Visible/UV light | Propagates substantially orthogonal to substrate surface |
| 26 | Transparent Window |  | Transparent to radiation |
| 28 | Reaction Vessel |  | Contains substrate and liquid |
| 30 | MCT Substrate | MCT | mercury cadmium telluride<br>cadmium telluride |
| 32 | Etch Mask | Silicon dioxide | silicon nitride<br>photoresist<br>noble metals such as platinum<br>Mylar tape |
| 34 | Liquid | 0.1% molar HCl | Contains etchant(s) or etchant(s) and passivant(s) |
|  | Etchant | 0.1% molar HCl | Etches substrate in absence of passivation layer; may be photo-activated or photo-enhanced.<br>Halogens (e.g. bromine, iodine)<br>$H_2O$ |
|  | Passivant | 0.1% molar $HIO_3$ | Iodic acid<br>Reacts with substrate to form passivation layer |
| 36 | Passivation layer | Iodates of Hg, Cd, Te<br>Iodides of Hg, Cd, Te<br>Oxides of Hg, Cd, Te<br>Combination of any of the above. | Product of passivant and substrate; removed or partially removed from surface by impinging radiation |
| 40 | Sidewall |  | Forms as etch proceeds in illuminated areas |
| 42 | Sidewall passivation layer |  | Forms on sidewall under edge of etch mask as etch proceeds; remains because sidewall is in shadow |

2. The method according to claim 1, wherein said illuminated areas are at a temperature substantially the same as the temperature of said unilluminated areas.

3. The method according to claim 1, wherein said liquid contains hydrochloric acid.

4. The method according to claim 1, wherein said liquid is H$_2$O.

5. The method according to claim 1, wherein said radiation is produced by a mercury/xenon arc lamp.

6. The method according to claim 1, wherein said mercury cadmium telluride has been deposited on a semiconductor substrate.

7. The method according to claim 1, wherein said mercury cadium telluride is part of an infrared detector array.

8. The method according to claim 1, wherein the direction of propagation of said radiation is substantially orthogonal to said surface.

9. The method according to claim 1, wherein said liquid is acidic.

10. A method to anisotropically etch mercury cadmium telluride, said method comprising:
   forming an etch mask on a surface of said mercury cadmium telluride to produce a masked surface;
   immersing said masked surface in a neutral salt solution; and
   illuminating said masked surface with radiation to produce illuminated areas and substantially unilluminated areas of said surface,
wherein said illuminated areas are etched at a substantially greater rate than said unilluminated areas.

11. The method according to claim 1, wherein the intensity of said radiation varies with time.

12. The method according to claim 1, wherein said liquid is made to flow with respect to said mercury cadmium telluride.

13. The method according to claim 1, wherein said radiation is monochromatic.

14. The method according to claim 1, wherein said etch mask is comprised of silicon dioxide.

15. The method according to claim 1, wherein said etch mask is comprised of silicon nitride.

16. The method according to claim 1, wherein said etch mask is comprised of one or more noble metals.

17. The method according to claim 1, wherein said etch mask is photoresist.

18. The method according to claim 1, wherein a passivant is added to said liquid, said passivant forming a passivation layer on said surface, said passivation layer being substantially insoluble in said unilluminated areas but substantially removed from said illuminated areas by said radiation, whereby the etch rate in said illuminated areas is substantially greater than the etch rate in said unilluminated areas.

19. The method according to claim 18, wherein said passivant is iodine.

20. The method according to claim 18, wherein said liquid contains hydrochloric acid.

21. A method to anisotropically etch mercury cadmium telluride, said method comprising:
   (a) immersing a surface of said mercury cadmium telluride in a liquid containing one or more etchants;
   (b) adding a passivant to said liquid, said passivant forming a passivation layer on said surface, said passivation layer being substantially insoluble in said liquid; and
   (c) illuminating portions of said surface with radiation to produce illuminated areas and substantially unilluminated areas, causing said passivation layer to be substantially removed from said illuminated areas,
causing said illuminated areas to be etched with said unilluminated areas remaining substantially unetched.

22. The method according to claim 21, wherein said passivant is added to said liquid before said surface is submersed.

23. The method according to claim 21, wherein said etchant is hydrochloric acid.

24. The method according to claim 21, wherein said etchant is H$_2$O.

25. The method according to claim 21, wherein said passivant is iodic acid.

26. A method to anisotropically etch mercury cadmium telluride, said method comprising:
   (a) immersing a surface of said mercury cadmium telluride in a liquid containing 0.1% molar HCl and 0.1% molar HlO$_3$; and
   (b) illuminating portions of said surface with radiation to produce illuminated areas and substantially unilluminated areas,
whereby said illuminated areas are etched at a rate substantially greater than said unilluminated areas.

27. The method according to claim 26, wherein said illuminated areas and said unilluminated areas are formed by an etch mask interposed between the source of said radiation and said surface.

* * * * *